(12) United States Patent
Boswell et al.

(10) Patent No.: US 9,095,894 B2
(45) Date of Patent: Aug. 4, 2015

(54) SINGLE CRYSTAL CASTING APPARATUS

(75) Inventors: John Harold Boswell, Derby (GB); Kevin Goodwin, Derby (GB); Andrew David Slater, Nottingham (GB); Amanda Barbara Borland, Nottingham (GB)

(73) Assignee: ROLLS-ROYCE PLC (GB)

( * ) Notice: Subject to any disclaimer, the term of this patent is extended or adjusted under 35 U.S.C. 154(b) by 398 days.

(21) Appl. No.: 12/718,001

(22) Filed: Mar. 5, 2010

(65) Prior Publication Data

US 2010/0252224 A1   Oct. 7, 2010

(30) Foreign Application Priority Data

Mar. 17, 2009   (GB) ................................... 0904492.6

(51) Int. Cl.
| | |
|---|---|
| B22C 9/08 | (2006.01) |
| B22D 1/00 | (2006.01) |
| B22D 27/04 | (2006.01) |
| B22D 43/00 | (2006.01) |
| B22C 9/04 | (2006.01) |
| C30B 11/04 | (2006.01) |

(52) U.S. Cl.
CPC ................ B22D 27/045 (2013.01); B22C 9/04 (2013.01); B22C 9/086 (2013.01); B22D 43/004 (2013.01); C30B 11/04 (2013.01)

(58) Field of Classification Search
CPC ............ B22C 9/04; B22C 9/02; B22C 9/086; B22C 9/082; B22C 9/08; B22D 27/00; B22D 43/004

USPC ............ 164/122–122.2, 129, 133–136, 164/335–337, 349–350, 358, 361
See application file for complete search history.

(56) References Cited

U.S. PATENT DOCUMENTS

| | | | | |
|---|---|---|---|---|
| 212,087 | A | * | 2/1879 | Baker et al. ................... 164/362 |
| 4,469,161 | A | * | 9/1984 | Higginbotham et al. .. 164/122.2 |
| 4,550,764 | A | | 11/1985 | Horton et al. |
| 4,591,383 | A | | 5/1986 | McGarry et al. |
| 4,721,567 | A | * | 1/1988 | Uram ............................ 210/489 |
| 4,862,947 | A | | 9/1989 | Horton et al. |
| 5,234,047 | A | * | 8/1993 | Rose ............................. 164/358 |
| 5,275,227 | A | | 1/1994 | Staub |
| 5,868,194 | A | | 2/1999 | Horwood |
| 7,152,659 | B2 | | 12/2006 | Boswell |
| 2005/0211408 | A1 | * | 9/2005 | Bullied et al. ............. 164/122.2 |
| 2005/0274478 | A1 | | 12/2005 | Verner et al. |

FOREIGN PATENT DOCUMENTS

| | | | |
|---|---|---|---|
| DE | 19859031 | C1 * | 7/2000 |
| DE | 4229417 | C2 * | 8/2001 |
| EP | 0787547 | | 8/1997 |

(Continued)

OTHER PUBLICATIONS

Extended European Search Report dated May 12, 2010 for EP Application No. 10250048.5.

Primary Examiner — Kevin P Kerns
Assistant Examiner — Jacky Yuen
(74) Attorney, Agent, or Firm — Grogan, Tuccillo & Vanderleeden, LLP

(57) ABSTRACT

A casting arrangement for the single crystal casting of a component in which a common feed for molten metal is provided with a filtration arrangement that incorporates an annular filter. Outlets in a housing surrounding the filter direct the filtered molten metal on to a seed crystal and into a spiral grain selector.

13 Claims, 3 Drawing Sheets

(56) References Cited

FOREIGN PATENT DOCUMENTS

| | | |
|---|---|---|
| EP | 1452251 | 9/2004 |
| EP | 1652603 | 5/2006 |
| FR | 2874340 | 2/2006 |
| GB | 2112309 A | 7/1983 |
| GB | 2260284 A | 4/1993 |

* cited by examiner

SINGLE CRYSTAL CASTING APPARATUS

CROSS REFERENCE TO RELATED APPLICATION

This application is entitled to the benefit of British Patent Application No. GB 0904492.6, filed on Mar. 17, 2009.

FIELD OF THE INVENTION

This invention concerns apparatus for use in single crystal casting of a component, and particularly but not exclusively casting of a turbine blade or vane for a jet engine, and also a single crystal casting arrangement.

BACKGROUND OF THE INVENTION

Component casting is used in order to produce a wide range of components and members. Essentially, the component is cast in a mould from a molten liquid and then allowed to cool in order to leave a solidified component. Some components such as turbine blades for jet engines require structural abilities such as high temperature creep resistance. This is achieved with turbine blades through forming a single crystal. At high temperatures, typically above half the absolute melting temperatures of the metal, grain boundaries within the metal become weaker than the grain bodies they surround such that the absence of grain boundaries in a single crystal provides resistance to creep.

Techniques for producing single crystal components are well known. Essentially the component is cast in a mould and then gradually withdrawn from a furnace in an appropriate manner such that propagation of a single crystal is achieved. Typically, a so called "pig-tail" selector is used in order to initiate a single grain or crystal growth. The most important consideration with respect to continued propagation of a single crystal within the component is to ensure so called directional solidification. This is achieved by gradual withdrawal, usually downwardly of the component from the furnace such that the temperature gradient is effectively controlled.

A preferred method of component casting is that known as the lost wax process. This is a traditional technique in which a component is initially formed as a wax structure and then a ceramic coat is placed upon that wax structure and allowed to harden. The wax is then removed, typically by heating, in order to leave the ceramic as a mould for the component. As indicated above, the component is cast from a molten liquid and then allowed to cool and solidify.

The bottom filling of seeded single crystal investment castings is common practice on large chill plate castings where there is sufficient room to locate filters and runners which feed molten metal from an upper pour cup or basin to the seed crystal. A typical casting arrangement 10 used on a large chill mould is shown in FIG. 1. The arrangement 10 includes a chill base 12 which supports an upstanding downpole 14 (or sprue). Mounted on top of the downpole 14 is a downwardly pointing conical pour cup 16 (or basin). A runner 18 in the form of a pipe extends downwardly from the pour cup 16 at a point towards the apex thereof, to feed molten metal to a mould. A filter 20 is provided in line with the runner 18, towards the top end of the runner 18.

The lower end of the runner 18 connects to the lower end of a mould such that molten metal extends over a seed crystal 22 and extends up into a spiral grain selector 24, which leads into a mould to produce a turbine blade 26 as shown. The mould in which the turbine blade 26 will be formed is not shown in FIG. 1. It is to be realised that a number of moulds and corresponding runners 18 will be provided spaced around the downpole 14, and typically for instance four blades may be made in a single arrangement 10.

Such an arrangement can generally only be applied to large chill furnaces in which there is sufficient room to provide the respective runners 18 and filters 20. With such a bottom filling arrangement the wax assembly is relatively difficult and the lead times are generally longer. The seed crystals 22 have to be fitted after shelling thereby adding a further manufacturing operation, increasing lead times and giving an opportunity for further non conformance due to poor fitting of the seed, contamination by ceramic adhesive, or the seeds actually falling out during handling of the moulds.

SUMMARY OF THE INVENTION

According to the present invention there is provided apparatus for use in single crystal casting of a component, the apparatus including a receptacle for receiving molten metal, a common feed extending downwardly from the receptacle to a filtration arrangement, the filtration arrangement including a housing which locates a filter, onto which filter liquid flowing through the common feed will pass, a plurality of outlets spaced around the perimeter of the housing to receive filtered molten metal, a respective connection leading outwardly relative to the housing from each outlet, which connections are connectable to a respective mould assembly.

The filter may be annular. An annular chamber may be provided within the housing to receive molten metal passing out of the filter, the annular chamber may extend around the filter within the housing.

The connections may extend substantially tangentially outwardly from the housing and may extend outwardly at an inclination of between 45 and 60 °relative to the housing.

The connections may be inclined downwardly relative to the housing, and may be inclined at a downward inclination of between 25 and 35°.

An upwardly inclined end portion may be provided at the distal end of a main portion of each of the connections. The end portion may have an upwards inclination of between 40 and 50°.

The receptacle, common feed and housing may be aligned substantially coaxially about a common vertical axis.

The invention also provides a single crystal casting arrangement, the arrangement including an apparatus according to any of the preceding six paragraphs, with a plurality of mould assemblies spaced around the apparatus.

The distal end of the main portions of the connections may be connected to the mould assemblies.

The connection main portions may be arranged such that molten metal passing therethrough passes onto a seed crystal in the respective mould assembly.

DETAILED DESCRIPTION OF THE PREFERRED EMBODIMENTS

Figure 2:
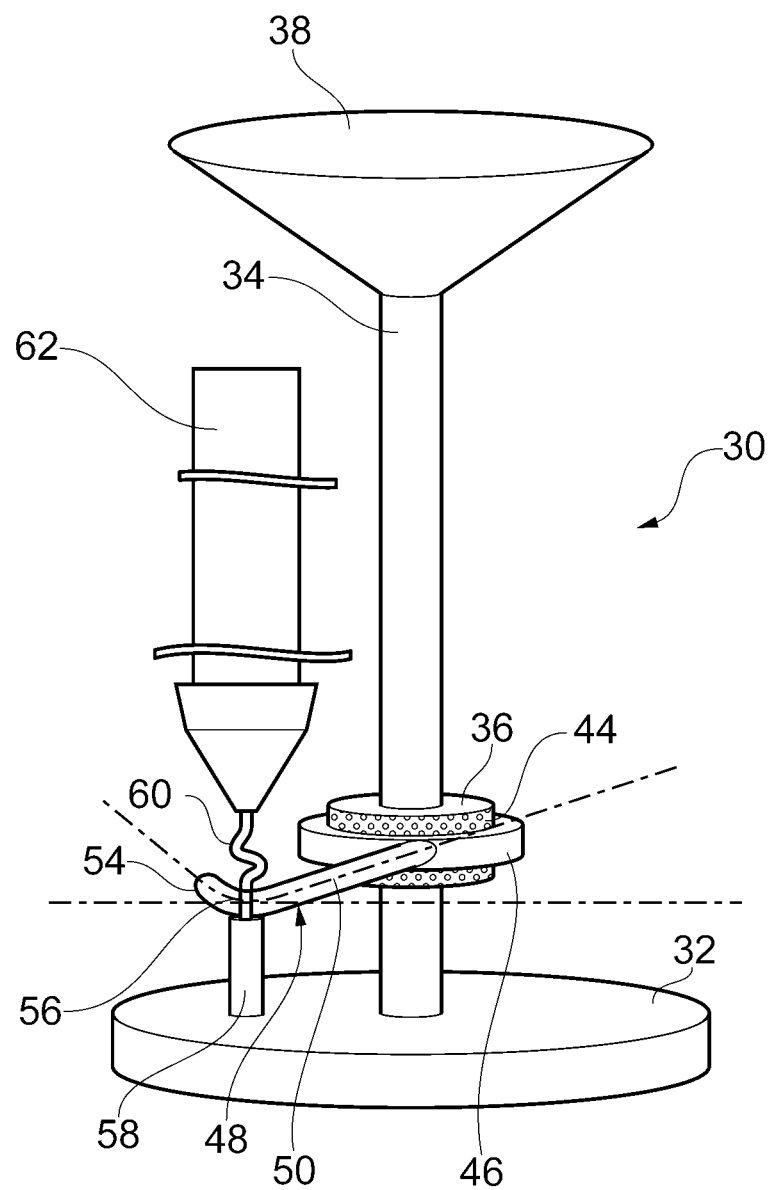
FIG. 2 is a similar view to FIG. 1 but of an arrangement according to the invention.
Figure 3:
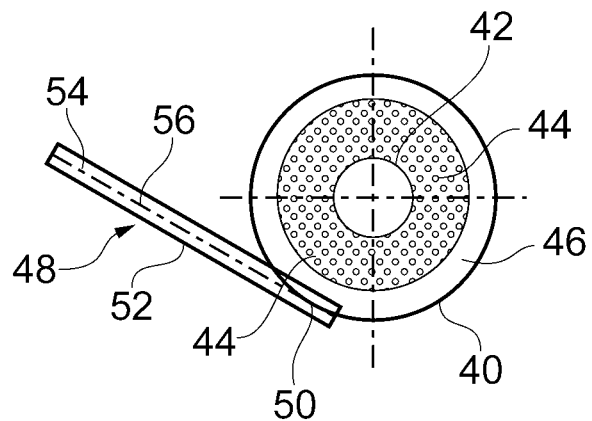
FIG. 3 is a diagrammatic downward looking cross sectional view through part of the arrangement of FIG. 2.

FIGS. 2 and 3 show a casting arrangement 30, which is similar in many aspects to the arrangement 10. Again a chill base 32 is provided from which a downpole 34 extends. In this instance a filter arrangement 36 is provided in the downpole 34 towards the chill base 32. The downpole 34 above the filter arrangement is hollow and extends to a pour cup 38 such that molten metal delivered into the pour cup 38 will pass down to the filter arrangement 36.

The filter arrangement 36 includes a housing 40 with a central open area 42 corresponding to the downpole 34. An annular filter 44 surrounds the open area 42. An annular chamber 46 surrounds part of the filter 44 such that molten metal passing down on the downpole 34 passes into the open area 40, through the filter 44 and into the annular chamber 46.

A plurality of connectors 48 extend tangentially from the chamber 46 and are in communication therewith through outlets 50. In the drawings only one such connector 48 is shown, but again typically four such connectors 48 could be provided. The connectors 48 are in the form of a pipe with a main part 52 and a distal upturned end 54. The connectors 48 extend tangentially from the filter arrangement 36.

The main part 52 of the connector 48 extends downwardly at an inclination of between 25 and 35°, whilst the upturned end 52 is inclined upwardly at approximately 45°. An opening 56 is provided at the distal end of the main part 50 of the connector 48 which enables molten material pouring therethrough to pour onto a seed crystal 58 and into a spiral grain selector 60 and to flow up into a mould to form a turbine blade 62.

Figure 1:
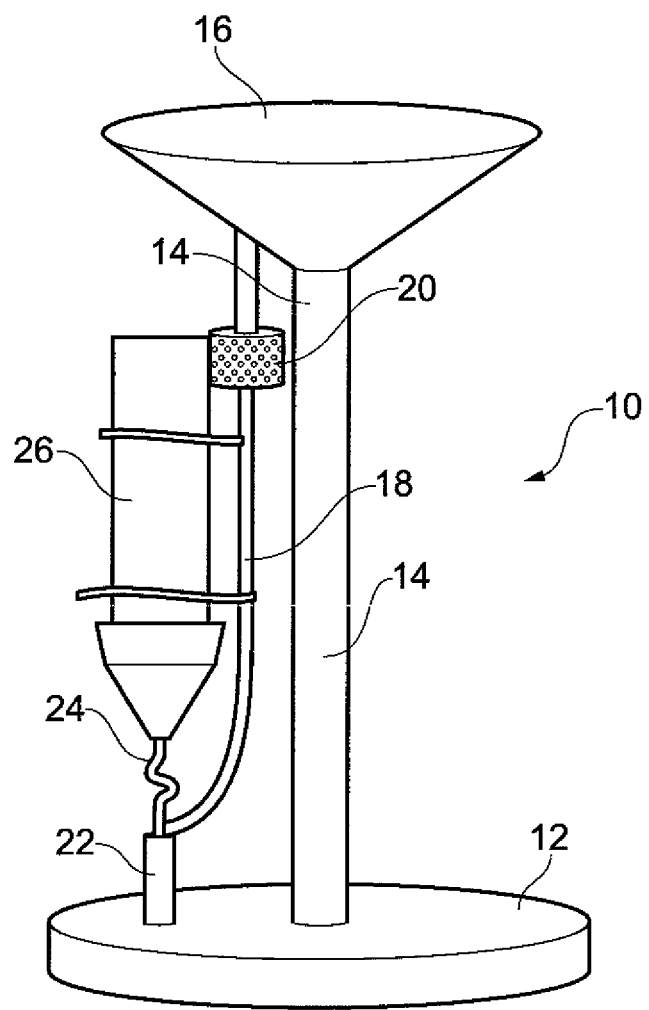
FIG. 1 is a diagrammatic side view of an existing single crystal casting arrangement.

The above-described arrangement provides a number of advantageous features over prior arrangements such as illustrated for example in FIG. 1. The provision of an annular chamber 46 around the filter 44 substantially prevents choking or blocking of the filter 44. The feature of the connectors 48 extending tangentially increases the flow area of the joint between the connector 48 and housing 40 preventing the connector 48 being in direct tension due to thermal expansion or contraction. The downward inclination of the connector 48 helps to prevent spurious grains forming in the connector 48 and growing into the casting. Spurious grains could otherwise be formed due to undercooling of the connection 48.

The upturned end 54 acts as a slag catch or slag trap to catch any dross or oxide film that may form on the seed crystal 58 during preheating of the mould, thereby preventing the oxide being washed into the mould by the action of filling the mould.

Overall, the above arrangement reduces wax assembly time. Only a single filter is required thereby providing a cost reduction, and the filter can be injected with the connector. The arrangement of the connectors enables the system to operate with a greater head of pressure than previously, and thus a finer pore sized filter can be used.

Using the downpole to feed molten metal, along with the arrangement of the connectors provides space saving relative to prior arrangements, and thus the arrangement is useful with both large chill and small bore furnaces. The arrangement also facilitates easier shelling of the wax mould assembly. Furthermore, with the above arrangement the integrity of the running system is generally greater after casting, therefore meaning that shell removal is easier.

The inclination of the connector helps to prevent potential fracture thereof due to contraction, and also provides greater space to facilitate attachment to the seed crystal. The inclination of the connectors helps to prevent secondary grains from entering the component mould cavity, which would result in rejection of the component.

Figure 4:
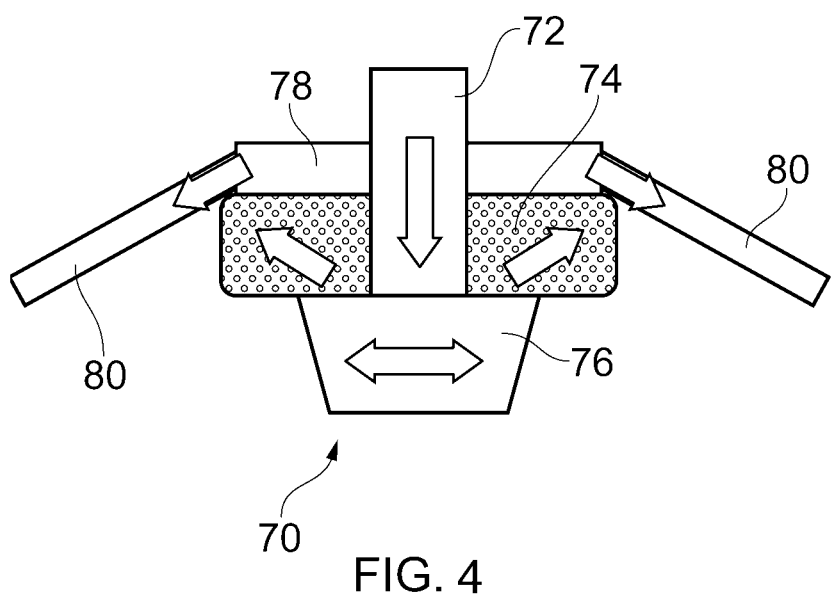
FIG. 4 is a diagrammatic cross sectional side view through part of a further crystal casting arrangement according to the invention.

FIG. 4 shows an alternative filter arrangement 70. In this instance the downpole 72 extends through an opening in an annular filter 74 into a reservoir 76 located beneath the filter 74. Molten metal can flow upwardly from the reservoir 76 into the filter 74. An annular chamber 78 is provided on top of the filter 74, and a plurality of connectors 80 extend from the annular chamber 78 in a similar manner to the connectors 48 described above. Such an arrangement would be suitable for large chill moulds.

Various other modifications may be made without departing from the scope of the invention. For instance, the filter and/or chambers in the filter arrangement may have a different shape or configuration in addition to the arrangements outlined above. The invention could be used with directional, solidified or non-seeded crystal castings.

What is claimed is:

1. Apparatus for use in single crystal casting of a component, the apparatus comprising:
   a receptacle for receiving molten metal,
   a common feed extending downwardly from the receptacle;
   a filtration arrangement downstream of the common feed, the filtration arrangement including:
   a housing arranged to receive, at a central part thereof, the molten metal from the common feed;
   a filter, enclosed in the housing, onto which the molten metal flowing through the common feed will pass;
   an annular chamber enclosed in the housing and surrounding the filter, the annular chamber and the filter being arranged such that the molten metal will pass substantially radially outward through the filter and then into the annular chamber, and the housing including a plurality of outlets spaced around the perimeter of the annular chamber to receive filtered molten metal from the annular chamber, each outlet thereby being in fluid communication with the entirety of the filter; and
   a respective connector leading outwardly relative to the annular chamber from each outlet, each connector connectable to a respective mould assembly.

2. Apparatus according to claim 1, wherein the filter is annular.

3. Apparatus according to claim 1, wherein the connectors extend substantially tangentially outwardly from the housing.

4. Apparatus according to claim 1, wherein at least some of the connectors include main parts that are inclined downwardly relative to the housing.

5. Apparatus according to claim 4, wherein the main parts of the connectors are inclined at a downward inclination of between 25 and 35°.

6. Apparatus according to claim 1, further comprising an upwardly inclined end portion at a distal end of a main portion of each of the connectors.

7. Apparatus according to claim 6, wherein the end portion has an upwards inclination of between 40 and 50°.

8. Apparatus according to claim 1, wherein the receptacle, common feed and housing are aligned substantially coaxially about a common vertical axis.

9. A single crystal casting arrangement, the arrangement including an apparatus according to claim 1, with a plurality of mould assemblies spaced around the apparatus.

10. An arrangement according to claim 9, wherein a distal end of a main portion of each connector is connected to a respective one of the mould assemblies.

11. An arrangement according to claim 10, wherein each connector main portion includes an opening arranged such that molten metal passing therethrough passes onto a seed crystal in the respective mould assembly.

12. An arrangement according to claim 11, wherein each connector further includes an upwardly inclined end portion extending distally from the opening of the main portion.

13. An arrangement according to claim 12, wherein the connector main portions are inclined downwardly from the housing, and each connector end portion is inclined at an upward inclination of between about 65° and about 85° relative to the respective main portion.

* * * * *